US012096649B2

(12) United States Patent
Cho et al.

(10) Patent No.: US 12,096,649 B2
(45) Date of Patent: Sep. 17, 2024

(54) DISPLAY APPARATUS AND METHOD OF MANUFACTURING THE SAME

(71) Applicant: SAMSUNG DISPLAY CO., LTD., Yongin-si (KR)

(72) Inventors: Jaewon Cho, Yongin-si (KR); Geurim Lee, Yongin-si (KR); Youngtaeg Jung, Yongin-si (KR); Wonmi Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 152 days.

(21) Appl. No.: 16/901,054

(22) Filed: Jun. 15, 2020

(65) Prior Publication Data

US 2021/0111371 A1 Apr. 15, 2021

(30) Foreign Application Priority Data

Oct. 15, 2019 (KR) ........................ 10-2019-0127861

(51) Int. Cl.
*H10K 50/844* (2023.01)
*H10K 59/12* (2023.01)
*H10K 59/121* (2023.01)
*H10K 59/122* (2023.01)
*H10K 71/00* (2023.01)
*H10K 102/00* (2023.01)

(52) U.S. Cl.
CPC ......... *H10K 50/844* (2023.02); *H10K 59/121* (2023.02); *H10K 59/122* (2023.02); *H10K 71/00* (2023.02); *H10K 59/1201* (2023.02); *H10K 2102/00* (2023.02)

(58) Field of Classification Search
CPC . H01L 51/5253–5256; H01L 2251/301; H01L 2227/323
See application file for complete search history.

(56) References Cited

U.S. PATENT DOCUMENTS

| | | | |
|---|---|---|---|
| 9,224,791 B2 | 12/2015 | Kim | |
| 10,319,797 B2 | 6/2019 | Kim et al. | |
| 10,439,165 B2 | 10/2019 | Kim et al. | |
| 11,063,238 B2 | 7/2021 | Lee et al. | |
| 11,094,773 B2 | 8/2021 | Lee et al. | |
| 2016/0285038 A1* | 9/2016 | Kim | .................. H01L 51/5237 |
| 2017/0345881 A1* | 11/2017 | Kim | .................. H01L 51/0097 |
| 2018/0033998 A1* | 2/2018 | Kim | .................. H01L 27/3246 |
| 2018/0124933 A1* | 5/2018 | Park | .................. H01L 51/5212 |
| 2019/0179466 A1* | 6/2019 | Kim | ...................... G06F 3/0416 |
| 2021/0066650 A1* | 3/2021 | Yu | ............................ H01L 51/56 |

FOREIGN PATENT DOCUMENTS

| | | |
|---|---|---|
| KR | 10-2008-0040280 | 5/2008 |
| KR | 10-2015-0043142 A | 4/2015 |
| KR | 10-2017-0134828 | 12/2017 |
| KR | 10-2018-0013452 | 2/2018 |
| KR | 10-2018-0047281 | 5/2018 |

(Continued)

*Primary Examiner* — Shaun M Campbell
(74) *Attorney, Agent, or Firm* — F. CHAU & ASSOCIATES, LLC

(57) ABSTRACT

A display apparatus includes a display area having a plurality of pixels. A non-display area surrounds the display area. A blocking block is arranged in the non-display area and protrudes to prevent a flow of a fluid outside the blocking block.

20 Claims, 16 Drawing Sheets

(56) References Cited

FOREIGN PATENT DOCUMENTS

| | | |
|---|---|---|
| KR | 10-2018-0048247 | 5/2018 |
| KR | 10-2018-0064025 | 6/2018 |
| KR | 10-2018-0064601 A | 6/2018 |
| KR | 10-2019-0075503 A | 7/2019 |
| KR | 10-2019-0112884 A | 10/2019 |

* cited by examiner

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2019-0127861, filed on Oct. 15, 2019 in the Korean Intellectual Property Office, the disclosure of which is incorporated by reference in its entirety herein.

1. Technical Field

One or more embodiments relate to a display apparatus and a method of manufacturing the same.

2. Discussion of Related Art

A display apparatus, such as an organic light-emitting display apparatus, includes a display panel to generate images. The display apparatus may further include a touch screen panel installed on the display panel to sense a touch input, such as a user's touch operation or the like.

The display apparatus may also include an encapsulation layer disposed on the display area to protect the display panel from exposure to oxygen or moisture from the outside. The encapsulation layer typically has a multi-layer configuration in which an organic encapsulation layer and an inorganic encapsulation layer are stacked. For example, the organic encapsulation layer and the inorganic encapsulation layer may be alternately stacked in the display area to encapsulate the display area.

The organic encapsulation layer mainly has a function of planarizing the encapsulation layer and the inorganic encapsulation layer prevents the penetration of oxygen or moisture.

However, when an organic encapsulation layer is not formed to have a sufficiently large and uniform thickness, a touch screen panel arranged thereon may be uneven due to curves or the like in the organic encapsulation layer. The curves of the organic encapsulation layer may cause two electrodes of the touch screen panel having an insulating layer therebetween to contact each other. Accordingly, the risk of a short circuit increases.

For example, a valley hole which is a discontinuous section may be formed in an organic insulating layer of a display panel to prevent a penetration path into the organic insulating layer. However, if the organic encapsulation layer of the encapsulation layer is not properly filled in the valley hole, additional curves may be formed and the risk of a short circuit is further increased.

The organic encapsulation layer may not be properly filled in the valley hole in instances in which the organic encapsulation layer, which has high flowability, flows too much outside of a display area, such as in an initial stage of forming the organic encapsulation layer. A dam is formed around the display area to prevent the organic encapsulation layer from flowing to the outer portion of the dam. However, if a large amount of the organic encapsulation layer flows and a portion thereof overflows the dam, the valley hole is not filled properly and thus the risk of a short circuit is increased.

SUMMARY

One or more exemplary embodiments of the present inventive concepts includes a display apparatus in which an excessive flow of an organic encapsulation layer to the outer portion of the dam may be quickly detected and handled, and a method of manufacturing the display apparatus.

Additional aspects will be set forth in part in the description which follows and, in part, will be apparent from the description, or may be learned by practice of the presented exemplary embodiments of the present inventive concepts.

According to one or more exemplary embodiments of the present inventive concepts, a display area includes a plurality of pixels. A non-display area surrounds the display area. A blocking block is arranged in the non-display area and protrudes to prevent a flow of a fluid outside the blocking block.

The blocking block may include a plurality of blocking blocks arranged discontinuously along a circumference of the display area.

The display apparatus may further include a dam between the display area and the blocking block.

A groove may be provided between the blocking block and the dam and accommodate the fluid.

The display apparatus may further include a crack dam in an outer portion of the blocking block.

The pixel may include a first conductive layer, a second conductive layer, a pixel electrode, a first planarization layer, which includes an organic insulating layer between the first conductive layer and the second conductive layer, and a second planarization layer, which includes an organic insulating layer between the second conductive layer and the pixel electrode.

The blocking block may include a layer including a same material as that of at least one of the first planarization layer and the second planarization layer.

The display apparatus may further include a pixel defining layer and a spacer on the second planarization layer, wherein the blocking block further includes a layer including a same material as that of at least one of the pixel electrode, the pixel-defining layer, and the spacer.

The display apparatus may further include an encapsulation layer covering the display area.

The encapsulation layer may include at least one inorganic encapsulation layer and at least one organic encapsulation layer, and layer including a same material as that of the at least one inorganic encapsulation layer of the encapsulation layer.

A planar shape of the blocking block may include one of a rectangular shape, a square shape, a circular shape, an elliptical shape, and a diamond shape.

The blocking block may include at least one organic insulating layer.

According to one or more exemplary embodiments of the present inventive concepts, a method of manufacturing a display apparatus includes forming a substrate having a display area and a non-display area surrounding the display area. The display area includes a plurality of pixels. A blocking block that protrudes is formed in the non-display area.

The blocking block may include a plurality of blocking blocks arranged discontinuously along a circumference of the display area.

The method may further include forming a dam in the non-display area.

A groove may be provided between the blocking block and the dam.

The method may further include forming, in the non-display area, a crack dam preventing propagation of cracks to the display area.

The method may further include forming an encapsulation layer covering the display area.

The forming of an encapsulation layer may include forming at least one inorganic encapsulation layer and forming at least one organic encapsulation layer, and when the organic encapsulation layer is observed between the blocking block and the dam when forming the at least one organic encapsulation layer, a thickness of the organic encapsulation layer may be increased.

The pixel may include a first conductive layer, a second conductive layer, a pixel electrode, a first planarization layer, which includes an organic insulating layer between the first conductive layer and the second conductive layer, and a second planarization layer, which includes an organic insulating layer between the second conductive layer and the pixel electrode.

The blocking block may include a layer including a same material as that of at least one of the first planarization layer and the second planarization layer.

A pixel defining layer and spacer may be further provided on the second planarization layer, wherein the blocking block is further formed as a layer including a same material as that of at least one of the pixel electrode, the pixel-defining layer, and the spacer.

A planar shape of the blocking block may include one of a rectangular shape, a square shape, a circular shape, an elliptical shape, and a diamond shape.

The blocking block may include at least one organic insulating layer.

In addition to the aforesaid details, other aspects, features, and advantages will be clarified from the following drawings, claims, and detailed description.

BRIEF DESCRIPTION OF THE DRAWINGS

The above and other aspects, features, and advantages of certain exemplary embodiments of the present inventive concepts will be more apparent from the following description taken in conjunction with the accompanying drawings, in which.

DETAILED DESCRIPTION OF EXEMPLARY EMBODIMENTS

Figure 1:
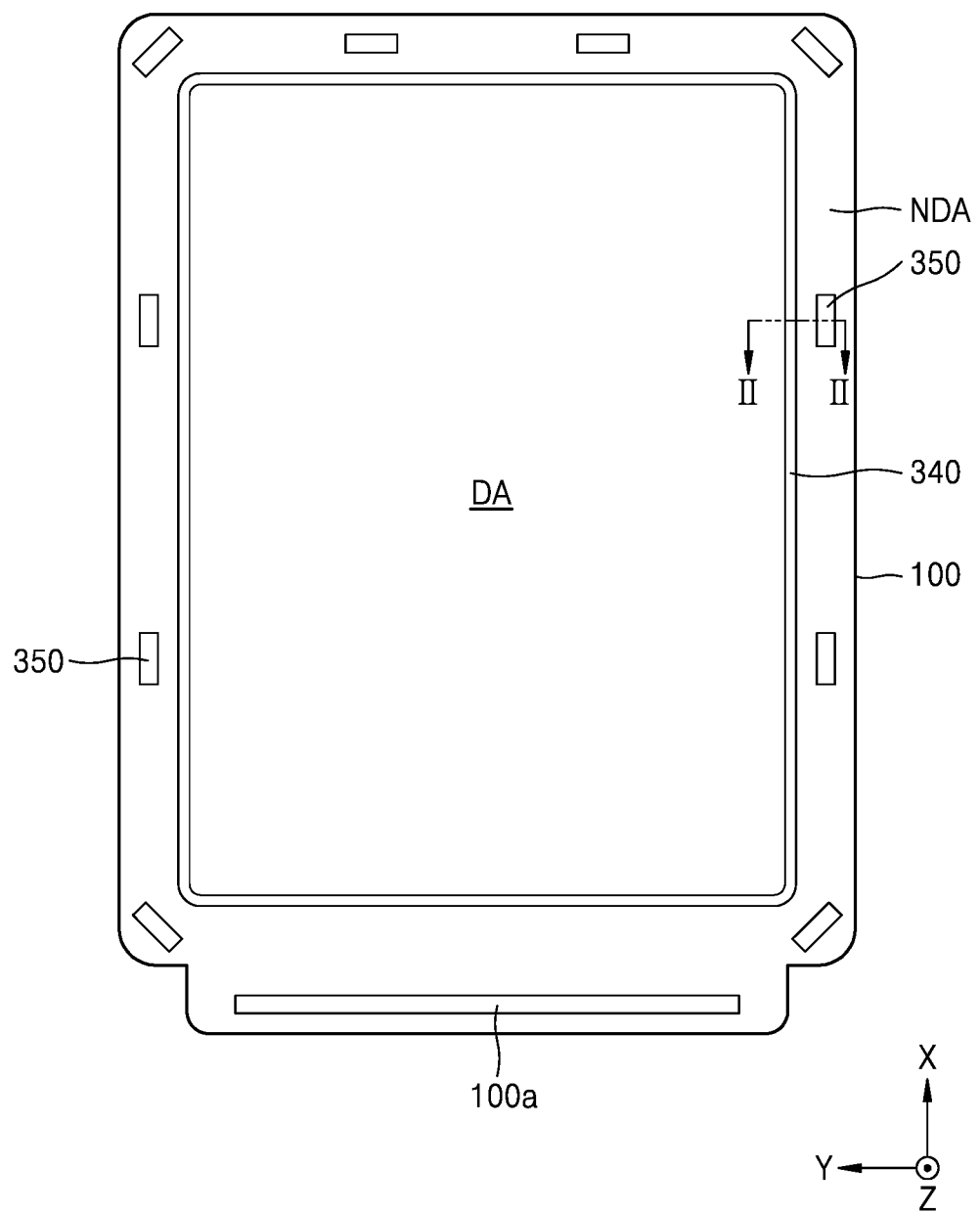
FIG. 1 is a top plan view illustrating a display apparatus according to an exemplary embodiment of the present inventive concepts.

Reference will now be made in detail to embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While such terms as "first," "second," etc., may be used to describe various elements, such elements must not be limited to the above terms. The above terms are used only to distinguish one element from another.

The terms used in the present specification are merely used to describe particular exemplary embodiments of the present inventive concepts, and are not intended to limit the present disclosure. Singular expressions, unless defined otherwise in contexts, include plural expressions. In the drawings, each constituent element is exaggerated, omitted, or schematically illustrated for convenience of explanation and clarity. In addition, the size of each constituent element does not perfectly reflect an actual size.

When each constituent element is described as being formed "on" or "under" a constituent element, the constituent element may be formed "directly" or "indirectly" with any other constituent element interposed therebetween "on" or "under" the constituent element. However, when a constituent element is referred to as being "directly on" another constituent element, no intervening constituent element may be interposed therebetween. The status of "on" or "under" of a constituent element is described based on the drawings.

Hereinafter, exemplary embodiments of the present inventive concepts will now be described more fully with reference to the accompanying drawings, and like reference numerals in the drawings denote like elements throughout the specification and repeated description thereof will be omitted.

FIG. 1 is a top plan view schematically illustrating a display panel of a display apparatus according to an exemplary embodiment, wherein an organic light-emitting display apparatus is illustrated as an example of the display apparatus. While the exemplary embodiment shown in FIGS. 1-2 include an organic light-emitting display device, exemplary embodiments of the present inventive concepts are not limited thereto and the display apparatus may include various other display devices known in the art.

As illustrated in the exemplary embodiment of FIG. 1, a substrate 100 of a display panel of the organ is light-emitting display apparatus includes a display area DA having a plurality of pixels P (see FIG. 3) arranged thereon to generate an image. A non-display area NDA surrounds the display area DA (e.g., in an X direction and/or a Y direction that are parallel to a top surface of the substrate 100 and are perpendicular with respect to each other). For example, as shown in the exemplary embodiment of FIG. 1, the display area DA may have a rectangular shape (e.g., extending in the X direction and Y direction) and the non-display area NDA may be arranged outside (e.g., surrounding) the display area DA on all four sides. However, in other exemplary embodiments, the display area DA may have any other shape, such as a polygonal shape or a circular shape, oval shape, an atypical shape, etc. Furthermore, in an exemplary embodiment, the display area DA may extend to at least one edge of the substrate 100 and the non-display area NDA may thus not surround at least one side of the display area DA. The non-display area NDA includes a terminal portion 100a or the like to connect a driving chip to the display area DA.

A dam 340 is disposed in the non-display area NDA and surrounds a boundary between the display area DA and the on-display area NDA. For example, as shown in the exemplary embodiment of FIG. 1, the dam 340 may have a rectangular shape (e.g., extending in the X and Y directions). The dam 340 prevents an organic encapsulation layer 420 of an encapsulation layer 400 (see FIG. 2), which is to be described later, from flowing in the non-display area NDA to an outer portion of the dam 340.

A blocking block 350 is included in the non-display area NDA to assist an operator in quickly detecting a flow of an organic encapsulation layer over the dam 340 to an outer portion of the dam 340 during a manufacturing process. The manufacturing process including the above will be described again later.

Figure 2:
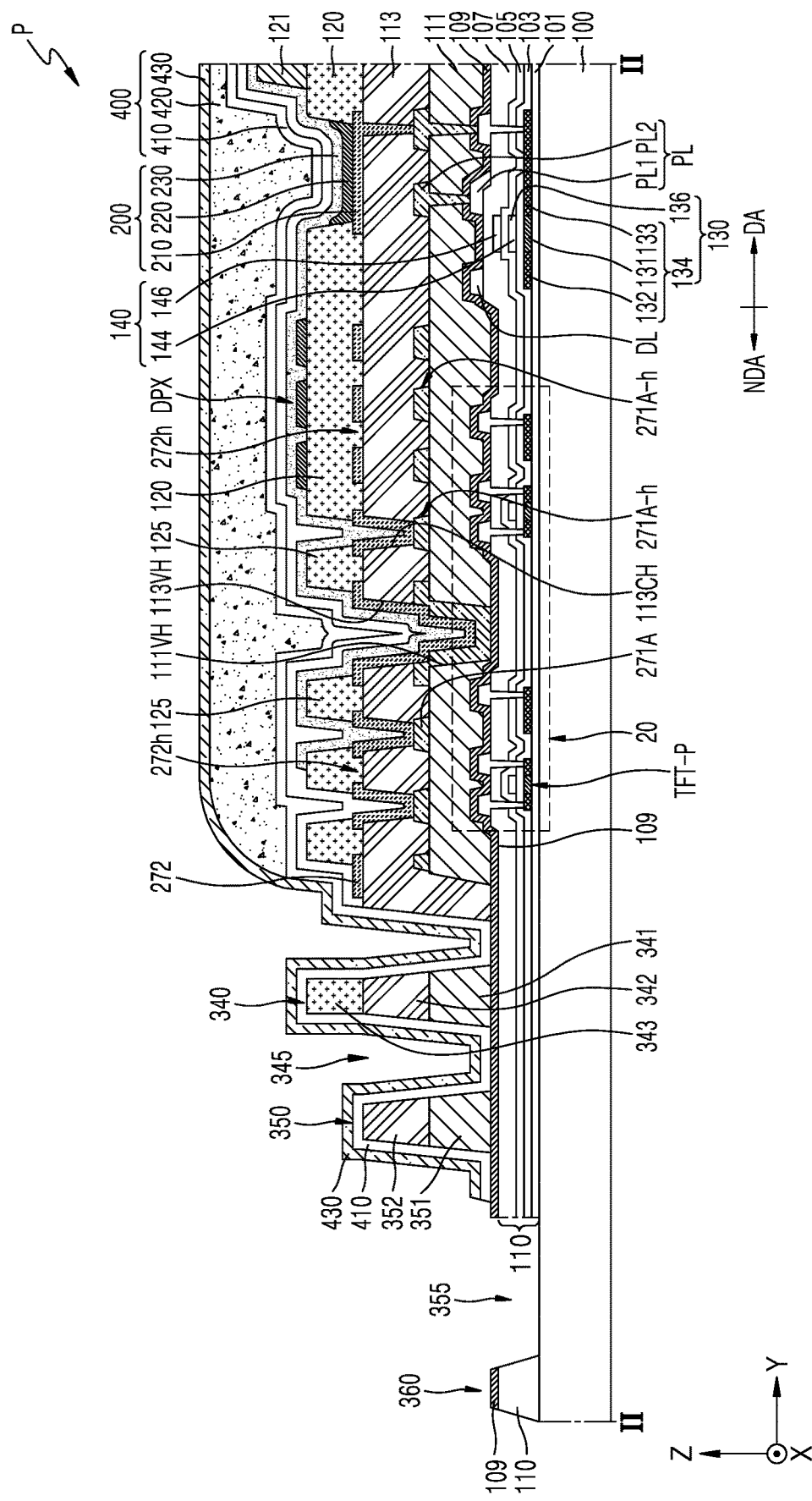
FIG. 2 is a cross-sectional view of the display apparatus taken alone line II-II of FIG. 1 according to an exemplary embodiment of the present inventive concepts.

FIG. 2 is a cross-sectional view of the display apparatus taken along line II-II of FIG. 1 according to an exemplary embodiment of the present inventive concepts, wherein the right side of the drawing illustrates a structure of a pixel P in the display area DA, and the left side illustrates the non-display area NDA including the dam 340 and the blocking block 350 or the like. While the exemplary embodiment shown in FIG. 2 shows one pixel P, the display area DA includes a plurality of pixels P in the display area DA, and a structure of each pixel P may be schematically shown as an equivalent circuit diagram in FIG. 3.

Figure 3:
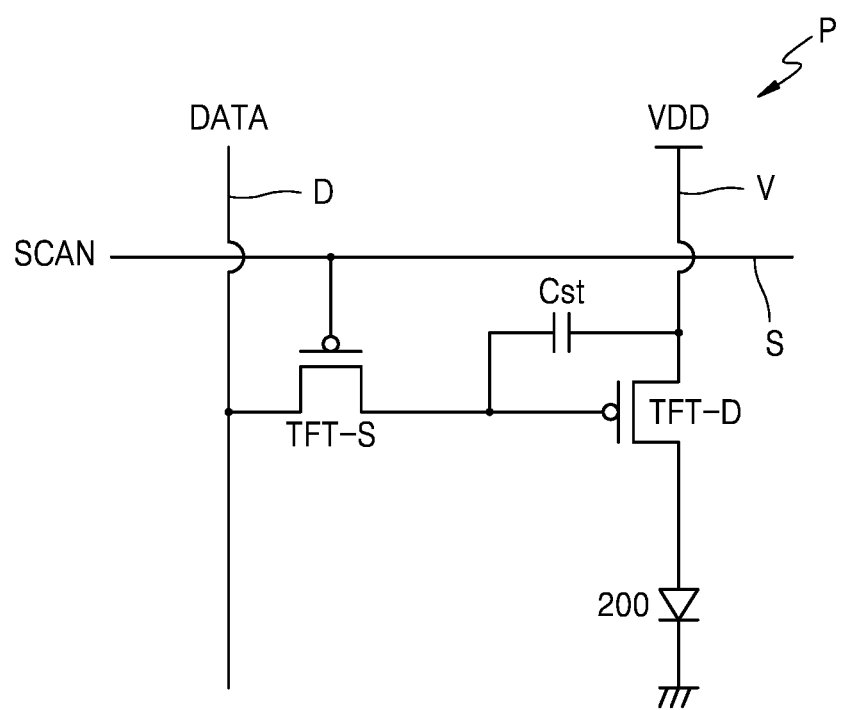
FIG. 3 is an equivalent circuit diagram of a pixel according to an exemplary embodiment of the present inventive concepts.

Regarding a circuit structure of each pixel P as illustrated in the exemplary embodiment of FIG. 3, the pixel P includes a switching thin-film transistor TFT-S, a driving thin-film transistor TFT-D, a capacitor Cst, and a light-emitting element 200.

The switching thin-film transistor TFT-S is driven by a scan signal SCAN applied to a scan line S to transfer a data signal DATA applied to a data line D.

The driving thin-film transistor TFT-D determines an amount of current flowing to the light-emitting element 200 through a power supply line V according to a data signal DATA transmitted the switching thin-film transistor TFT-S.

In an exemplary embodiment, the capacitor Cst stores a data signal transmitted via the switching thin-film transistor TFT-S, for one frame.

Each pixel P operates according to the principle of a circuit as described above. In the exemplary embodiment shown in FIG. 2, the switching thin-film transistor TFT-S is omitted and the driving thin-film transistor TFT-D (corresponding to reference numeral 130 in FIG. 2) and the capacitor Cst (corresponding to reference numeral 140 in FIG. 2) and the light-emitting element 200 are mainly illustrated. However, a cross-sectional view of the switching thin-film transistor TFT-S is identical to that of the driving thin-film transistor TFT-D, and in the description below, both will be referred to as a thin-film transistor without limiting the purpose thereof.

The display area DA or the non-display area NDA are formed together as various conductive layers and insulating layers are stacked on the substrate 100 and thus materials of elements of the display area DA or the non-display area NDA may be identical to each other. For example, when a first planarization layer 111 and a second planarization layer 113 of the display area DA are formed, a first layer 341 and a second layer 342 of the dam 340 in the non-display area NDA may be respectively formed of a same material and on a same layer as the first planarization layer 111 and the second planarization layer 113, and at the same time, a first layer 351 and a second layer 152 of the blocking block 350 may also be respectively formed of a same material and on a same layer as the first planarization layer 111 and the second planarization layer 113.

A buffer layer 101 may be formed on the substrate 100. For example, as shown in the exemplary embodiment of FIG. 2, a lower surface of the buffer layer 101 may be formed directly on an upper surface of the substrate 100 (e.g., in a Z direction that extends in a thickness direction of the substrate 100 and is perpendicular to the X and Y directions). In an exemplary embodiment, the substrate 100 may include a plastic such as polyethylene terephthalate (PET), polyethylene naphthalate (PEN), polyimide, or the like. In an exemplary embodiment, the substrate 100 may include a multi-layer configuration that includes a barrier layer of an inorganic material, disposed between plastic layers including polyimide or the like.

The buffer layer 101 may prevent foreign substances or moisture from penetrating the substrate 100. For example, in an exemplary embodiment, the buffer layer 101 may include an inorganic material such as silicon oxide ($SiO_x$), silicon nitride ($SiN_x$) or/and silicon oxynitride (SiON) and may include a single layer or a multi-layer. However, exemplary embodiments of the present inventive concepts are not limited thereto.

A thin-film transistor 130 and a storage capacitor 140 may be disposed on the substrate 100 in the display area DA, and the light-emitting element 200, which is a display element electrically connected to them, may also be disposed on the substrate 100 in the display area DA. For example, as shown in the exemplary embodiment of FIG. 2, a lower surface of the thin-film transistor 130 may directly contact an upper surface of the buffer layer 101. The thin-film transistor 130 of FIG. 2 may correspond to the driving thin-film transistor TFT-D from among the thin-film transistors included in the pixel circuit described with reference to FIG. 3, and the storage capacitor 140 of FIG. 2 corresponds to the capacitor Cst described with reference to FIG. 3.

The thin-film transistor 130 includes a semiconductor layer 134 and a gate electrode 136 which overlaps the semiconductor layer 134 (e.g., in the Z direction). The semiconductor layer 134 may include, for example, polysilicon. The semiconductor layer 134 may include a channel area 131 overlapping the gate electrode 136 (e.g., in the Z direction) and a source area 132 and a drain area 133 that are arranged on both sides of the channel area 131 (e.g., in the Y direction) and include impurities of a higher concentration than that of the channel area 131. The impurities may include N-type impurities or P-type impurities. The source area 132 and the drain area 133 may be regarded as a source electrode and a drain electrode of the thin-film transistor 130.

While the semiconductor layer 134 including polysilicon is described in the present exemplary embodiment, exemplary embodiments of the present inventive concepts are not limited thereto. For example, in another exemplary embodiment, the semiconductor layer 134 may include amorphous silicon or an organic semiconductor material.

A gate insulating layer 103 may be arranged between the semiconductor layer 134 and the gate electrode 136 (e.g., in the Z direction). For example, as shown in the exemplary embodiment of FIG. 2, a lower surface of the gate insulating layer 103 may directly contact upper surfaces of the buffer layer 101 and the semiconductor layer 134 and the upper surface of the gate insulating layer 103 may directly contact lower surfaces of a first interlayer insulating layer 105 and the gate electrode 136. In an exemplary embodiment, the gate insulating layer 103 may include an inorganic material layer such as silicon oxynitride (SiON), silicon oxide (SiO$_x$), and/or silicon nitride (SiN$_x$), and the inorganic material layer may include a single layer or a multi-layer. However, exemplary embodiments of the present inventive concepts are not limited thereto.

The storage capacitor 140 includes first and second storage capacitive plates 144 and 146 that overlap each other (e.g., in the Z direction). The first interlayer insulating layer 105 may be disposed between the first and second storage capacitive plates 144 and 146 (e.g., in the Z direction). The first interlayer insulating layer 105 has a layer having a certain permittivity and may include an inorganic material layer such as silicon oxynitride (SiON), silicon oxide (SiO$_x$), and/or silicon nitride (SiN$_x$) and may include a single layer or a multi-layer. In FIG. 2, the second storage capacitive plate 146 overlapping the thin-film transistor 130 and the first storage capacitive plate 144 corresponding to the gate electrode 136 of the thin-film transistor 130 are illustrated. However, exemplary embodiments of the present inventive concepts are not limited thereto. According to another exemplary embodiment, the storage capacitor 140 may not overlap the thin-film transistor 130, and the first storage capacitive plate 144 may be an independent component that is separate from the gate electrode 136 of the thin-film transistor 130.

The storage capacitor 140 may be covered by a second interlayer insulating layer 107. For example, as shown in the exemplary embodiment of FIG. 2, a lower surface of the second interlayer insulating layer 107 may directly contact upper surfaces of the first interlayer insulating layer 105 and the second storage capacitive plate 146. In an exemplary embodiment, the second interlayer insulating layer 107 may include an inorganic material layer such as silicon oxynitride (SiON), silicon oxide (SiO$_x$), and/or silicon nitride (SiN$_x$) and may include a single layer or a multi-layer. However, exemplary embodiments of the present inventive concepts are not hunted thereto.

A driving voltage line PL may include a first conductive layer PL1 and a second conductive layer PL2. For example, as shown in the exemplary embodiment of FIG. 2, a bottom surface of the first conductive layer PL1 may be disposed directly on the second interlayer insulating layer 107. A lower surface of the second conductive line PL2 may be disposed directly on an upper surface of the first planarization layer 111. The first conductive layer PL1 may include a same material as the material of a data line DL. For example, in an exemplary embodiment, the first conductive layer PL1 and the data line DL may include aluminum (Al), copper (Cu), titanium (Ti), or the like and may include a multi-layer or a single layer. According to an exemplary embodiment, the first conductive layer PL1 and the data line DL may each have a multi-layer structure of Ti/Al/Ti.

The second conductive layer PL2 may be arranged above the first conductive layer PL1 with the first planarization layer 111 therebetween (e.g., in the Z direction) and may be electrically connected to the first conductive layer PL1 via a contact hole defined in the first planarization layer 111. In an exemplary embodiment, the second conductive layer PL2 may include at least one compound selected from aluminum (Al), copper (Cu), titanium (Ti), or the like and may include a multi-layer or a single layer. According to an exemplary embodiment, the second conductive layer PL2 may include a multi-layer structure of Ti/Al/Ti. The first planarization layer 111 may include an organic insulating material such as at least one compound selected from an imide polymer, a general-use polymer (e.g., polymethylmethacrylate (PMMA) or polystyrene (PS)), a polymer derivative having a phenolic group, an acrylic polymer, an aryl ether polymer, an amide polymer, a fluorine polymer, a p-xylene polymer, a vinyl alcohol-based polymer, and a blend thereof. According to an exemplary embodiment, the first planarization layer 111 may include polyimide.

The driving voltage line PL is configured to supply an electrical signal, such as the driving voltage ELVDD, to a plurality of pixels. A voltage drop or the like in the driving voltage PL needs to be prevented to provide a display apparatus having high-definition images. According to an exemplary embodiment, since the driving voltage line PL includes the first conductive layer PL1 and the second conductive layer PL2 that are electrically connected to each other, the resistance of the driving voltage line PL may be reduced, and thus, also when a pixel area is reduced to implement a high-resolution display apparatus, a voltage drop due to resistance of the driving voltage line PL, or the like, may be prevented or minimized.

The driving voltage line PL is covered by the second planarization layer 113. For example, as shown in the exemplary embodiment of FIG. 2, a lower surface of the second planarization layer 113 may be disposed directly on upper surfaces of the first planarization layer 111 and the second conductive layer PL2. In an exemplary embodiment, the second planarization layer 113 may include an imide polymer, a general-use polymer (e.g., polymethylmethacrylate (PMMA) or polystyrene (PS)), a polymer derivative having a phenolic group, an acrylic polymer, an aryl ether polymer, an amide polymer, a fluorine polymer, a p-xylene polymer, a vinyl alcohol-based polymer, and a blend thereof. For example, in an exemplary embodiment, the second planarization layer 113 may include polyimide.

A pixel electrode 210 is arranged on the second planarization layer 113. For example, as shown in the exemplary embodiment of FIG. 2, a lower surface of the pixel electrode 210 may be disposed directly on an upper surface of the second planarization layer 113. A pixel-defining layer 120 is arranged on an upper surface of the second planarization layer 113 and on lateral edges of the pixel electrode 210. The pixel-defining layer 120 may define a pixel by having an opening corresponding to each sub-pixel. For example, the opening may expose at least a center portion of the pixel electrode 210. In addition, the pixel-defining layer 120 may increase a distance between edges of the pixel electrode 210 and an opposite electrode 230, thereby preventing an arc or the like therebetween. In an exemplary embodiment, the pixel-defining layer 120 may include, for example, an organic material such as polyimide or hexamethyldisiloxane (HMDSO). However, exemplary embodiments of the present inventive concepts are not limited thereto.

A spacer 121 may be arranged on the pixel-defining layer 120. For example, as shown in the exemplary embodiment of FIG. 2, a lower surface of the spacer 121 may be disposed directly on an upper surface of the pixel-defining layer 120. The spacer 121 may support a mask in a to a manufacturing process in which masks are used. In an exemplary embodiment, the spacer 121 may include an organic insulating material such as at least one compound selected from polyimide, polyamide, an acrylic resin, benzocyclobutene, HMDSO, and a phenolic resin. The spacer 121 may be formed by spin coating or the like, and may include a single layer or a multi-layer.

An intermediate layer 220 may be disposed on the pixel electrode 210. For example, as shown in the exemplary embodiment of FIG. 2, a lower surface of the intermediate layer 220 may be disposed directly on an upper surface of the pixel electrode 210. The intermediate layer 220 may include a low molecular weight material or a polymer material. In embodiments in which the intermediate layer 220 includes a low molecular weight material, the intermediate layer 220 may have a structure in which a hole injection layer (HIL), a hole transport layer (HTL), an electron transport layer (ETL), an electron injection layer (EIL), or the like are stacked in a single or complex structure, and may include various organic materials such as copper phthalocyanine (CuPc), N,N'-Di(naphthalene-1-yl)-N,N'-diphenyl-benzidine (NPB), tris-8-hydroxyquinoline aluminum (Alq3), or the like. In an exemplary embodiment, the above layers may be formed using a vacuum deposition method.

In embodiments in which the intermediate layer 220 includes a polymer material, the intermediate layer 220 may typically have a structure including an HTL and an EML. In an exemplary embodiment, the HTL may include poly(3,4-ethylenedioxythiophene) (PEDOT), and the EML may include a polymer material such as poly-phenylenevinylene (PPV)-based polymer material and a polyfluorene-based polymer material. However, the structure of the intermediate layer 220 is not limited to the above-described embodiment, and the intermediate layer 220 may have various structures. For example, at least one of layers of the intermediate layer 220 may be integrally formed with a plurality of pixel electrodes 210. Alternatively, the intermediate layer 220 may include a layer patterned to correspond to each of a plurality of pixel electrodes 210.

The opposite electrode 230 may be arranged in the display area DA and may cover the display area DA. For example, as shown in the exemplary embodiment of FIG. 2, a lower surface of the opposite electrode 230 may be disposed directly on an upper surface of the intermediate layer 220. The opposite electrode 230 may extend (e.g., in the Y direction) and may also be disposed directly on an upper surface of the pixel defining layer 120. In an exemplary embodiment, the opposite electrode 230 may extend (e.g., in the Y direction) across a plurality of pixels and may be integrally formed to cover a plurality of pixels.

An encapsulation layer 400 covers the light-emitting element 200 and may prevent the light-emitting element 200 from being damaged by moisture or oxygen from the outside. The encapsulation layer 400 may cover the display area DA and extend beyond the display area DA. For example, as shown in the exemplary embodiment of FIG. 2, the encapsulation layer 400 extends to the non-display area NDA. The encapsulation layer 400 may include at least one inorganic encapsulation layer and at least one organic encapsulation layer. In the exemplary embodiment of FIG. 2, the encapsulation layer 400 includes a first inorganic encapsulation layer 410, an organic encapsulation layer 420, and a second inorganic encapsulation layer 430. As shown in the exemplary embodiment of FIG. 2, a lower surface of the organic encapsulation layer 420 is disposed directly on an upper surface of a first inorganic encapsulation layer 410. A lower surface of the second inorganic encapsulation layer 430 is disposed directly on an upper surface of the organic encapsulation layer 420.

The first inorganic encapsulation layer 410 covers the opposite electrode 230. In an exemplary embodiment, the first inorganic encapsulation layer 410 includes at least one compound selected from silicon oxide, silicon nitride, and/or oxynitride. In some exemplary embodiments, a plurality of layers including a capping layer may be disposed between the first inorganic encapsulation layer 410 and the opposite electrode 230 (e.g., in the Z direction). As the first inorganic encapsulation layer 410 is formed according to structures under the first inorganic encapsulation layer 410, an upper surface of the first inorganic encapsulation layer 410 may not be even or flat (e.g., extending substantially in the Y direction). The organic encapsulation layer 420 covers the first inorganic encapsulation layer 410, and planarizes the encapsulation layer 400 by having an upper surface that is approximately even or flat (e.g., extending substantially in the Y direction). For example, as shown in the exemplary embodiment of FIG. 2, an upper surface of a portion of the organic encapsulation layer 420 corresponding to the display area DA may be approximately even or flat. In an exemplary embodiment, the organic encapsulation layer 420 may include at least one material selected from polyethylene terephthalate, polyethylene naphthalate, polycarbonate, polyimide, polyethylene sulfonate, polyoxymethylene, polyarylate, and hexamethyldisiloxane. The second inorganic encapsulation layer 430 covers the organic encapsulation layer 420. In an exemplary embodiment, the second inorganic encapsulation layer 430 may include silicon oxide, silicon nitride, and/or oxynitride. However exemplary embodiments of the present inventive concepts are not limited thereto.

A touch screen panel for a touch operation by a user is installed on the encapsulation layer 400. For example, the touch screen panel may be disposed directly on an upper surface of the encapsulation layer 400.

Referring to the non-display area NDA of FIG. 2, an inorganic insulating layer 110 is arranged on the substrate 100. For example, a lower surface of the inorganic insulating layer 110 may be disposed directly on the substrate 100 in the non-display area NDA. As shown in the exemplary embodiment of FIG. 2, the inorganic insulating layer 140 may include at least one of the buffer layer 101, the gate insulating layer 103, and the first and second interlayer insulating layers 105 and 107 described above. However, exemplary embodiments of the present inventive concepts are not limited thereto.

The first planarization layer 111 is arranged on a first scan driving circuit 20 including a peripheral thin-film transistor TFT-P, and a first power supply wire layer 271A is arranged on the first planarization layer 111. For example, as shown in the exemplary embodiment of FIG. 2, a lower surface of the first planarization layer 111 may be disposed directly on an upper surface of the first scan driving circuit 20 and a lower surface of the first power supply wire layer 271A is disposed directly on an upper surface of the first planarization layer 111.

The first power supply wire layer 271A is arranged on the first planarization layer 111 to overlap the first scan driving circuit 20 (e.g., in the Z direction), and may prevent damage to the first scan driving circuit 20 due to external static electricity.

A partial area of the first power supply wire layer 271A is located in a first valley hole 111VH of the first planarization layer 111, and through the first valley hole 111VH. The partial area of the first power supply wire layer 271A may contact an inorganic insulating layer 109 arranged under the first planarization layer 111. Another area of the first power supply wire layer 271A includes first holes 271A-h. The first holes 271A-h may correspond to an outgassing path through which impurities in the first planarization layer 111 may be discharged.

The second planarization layer 113 is arranged on the first power supply wire layer 271A. The second planarization layer 113 may include a second valley hole 113VH overlapping (e.g., in the Z direction) the first valley hole 111VH, and a partial area of a connection electrode layer 272 may contact the first power supply wire layer 271A through the second valley hole 113VH. Like the first valley hole 111VH, the second valley bole 113VH may prevent a penetration path of external impurities (e.g., moisture, etc.) moving toward the display area DA through a bulk of the second planarization layer 113.

For example, by forming a discontinuous section by respectively forming the first and second valley holes 111VH and 113VH in the first and second planarization layers 111 and 113, a penetration path from the outside into the display area DA is prevented. However, when the organic encapsulation layer 420 of the encapsulation layer 400 is not properly filled in the first and second valley holes 111VH and 113VH, the risk of a short circuit in a touch screen panel may increase as previously described. Accordingly, the blocking block 350 is provided according to the present embodiment, to reduce the risk of a short circuit due to an in proper filling of the first and second valley holes 111VH and 113VH.

The second planarization layer 113 may include a contact hole 113CH exposing the first power supply wire layer 271A, and the connection electrode layer 272 may contact the first power supply wire layer 271A through the contact hole 113CH. In an exemplary embodiment, a center of the contact hole 113CH of the second planarization layer 113 may be offset (e.g., in the Y direction) from a center of the first hole 271A-h of the first power supply wire layer 271A.

The connection electrode layer 272 may be covered by an insulating layer, for example, an insulating material layer of the pixel-defining layer 120, and when patterning the insulating material layer of the pixel-defining layer 120, a portion of the insulating material layer corresponding to a second hole 272h, may be patterned in an island shape to form protrusions 125 that extend in the Z direction.

The opposite electrode 230 of the light-emitting element 200 extends over a dummy pixel DPX in the non-display area NDA and extends further within the non-display area NDA and may contact the connection electrode layer 272 exposed between the protrusions 125.

The first power supply wire layer 271A and the connection electrode layer 272 may be arranged to contact the first scan driving circuit 20 to protect the first scan driving circuit 20 from external static electricity, and may contact the opposite electrode 230 on the first scan driving circuit 20 to reduce resistance and thus prevent or minimize a voltage drop of a common voltage supplied to the opposite electrode 230 and improve power consumption of the display apparatus.

As shown in the exemplary embodiment of FIG. 2, the dam 340 and the blocking block 350 are included in the non-display area NDA. As shown in the exemplary embodiment of FIG. 1, the dam 340 has a closed loop shape extending in the X and Y directions to continuously surround the display area DA. A plurality of blocking blocks 350 are discontinuously arranged apart from each other (e.g., in the X and/or Y directions) in an outer portion of the dam 340 (e.g., the lateral sidewall of the dam 340 that is farthest from the display area DA) adjacent to a circumference of the display area DA.

As shown in the exemplary embodiment of FIG. 2, the dam 340 includes a first layer 341 formed of a same material and on a same layer as the first planarization layer 111. A second layer 342 is disposed directly on the first layer 341 and is formed of a same material and on a same layer as the second planarization layer 113. A third layer 343 is disposed directly on the second layer 352 and is formed of a same material and on a same layer as the pixel-defining layer 120. For example, when forming the first and second planarization layers 111 and 113 and the pixel-defining layer 120 of the display area DA, the first, second, and third layers 341, 342, and 343 of the dam 340 are also formed together by using an organic insulating layer of a same material as the first and second planarization layers 111 and 113 and the pixel-defining layer 120. In addition, the first, second, and third layers 341, 342, and 343, which are organic insulating layers, are covered by a material that is the same as that of the first and second inorganic encapsulation layers 410 and 430 of the encapsulation layer 400. For example, when forming the first and second inorganic encapsulation layers 410 and 430 of the encapsulation layer 400, the first, second, and third layers 341, 342, and 343 of the dam 340 are also covered.

The blocking block 350 includes a first layer 351 formed of a same material and on a same layer as the first planarization layer 111 and a second layer 352 formed of a same material and on a same layer as the second planarization layer 113. The second layer 352 is formed directly on the first layer 351 of the blocking block 350. For example, when forming the first and second planarization layers 111 and 113 of the display area DA, the first and second layers 351 and 352 of the blocking block 350 are also formed together by using an organic insulating layer of a same material as the first and second planarization layers 111 and 113. Likewise, the first and second layers 351 and 352, which are organic insulating layers, are covered by a material that is the same as the material of the first and second inorganic encapsulation layers 410 and 430 of the encapsulation layer 400. For example, when forming the first and second inorganic encapsulation layers 410 and 430 of the encapsulation layer 400, the first and second layers 351 and 352 of the blocking block 350 are also covered.

The blocking block 350 is formed in the outer portion of the dam 340 (e.g., the lateral sidewall of the dam 340 that is farther away from the display area DA) to form a monitoring groove 345 between adjacent lateral side surfaces of the dam 340 and the blocking block 350. For example, the monitoring groove 345 is formed between the outer sidewall of the dam 340 (e.g., a lateral side surface that is farthest away from the display area DA) and an inner sidewall of the blocking block 350 (e.g., a lateral side surface that is closest to the display area DA). The monitoring groove 345 permits the monitoring of whether the organic encapsulation layer 420 of the encapsulation layer 400 has overflowed the dam 340 to flow to an outer portion thereof.

For example, when forming the organic encapsulation layer 420 of the encapsulation layer 400, if the organic encapsulation layer 420, which has good flowability, excessively overflows outside the dam 340, a fluid of the organic encapsulation layer 420 is collected in the monitoring groove 345 between the blocking block 350 and the dam 340 and does not flow further outside past the inner sidewall of the blocking block. If the fluid of the organic encapsulation layer 420 continuously flowed and spread over the entire non-display area NDA, it would be difficult to quickly identify the fluid of the organic encapsulation layer 420 because the fluid is difficult to distinguish from the surroundings thereof. However, when the fluid of the organic encapsulation layer 420 is stopped by the blocking block 350 and collected in the monitoring groove 345, a relatively thick layer is formed even temporarily in the monitoring groove 345 and thus is conspicuous and distinguishable from the surroundings thereof outside the monitoring groove 345. Therefore, the overflowed fluid that is collected in the monitoring groove 345 may be easily visible and distinguished by the naked eye or a monitoring camera.

Accordingly, when a fluid of the organic encapsulation layer 420 is observed in the monitoring groove 345, this indicates that the organic encapsulation layer 420 of the encapsulation layer 400 has excessively flowed to the outer portion of the dam 340, and thus that the organic encapsulation layer 420, which is provided to planarize the encapsulation layer 400, has not been sufficiently formed. In such instances, as described above, curves are formed in the encapsulation layer 400 and a touch screen panel to be formed thereon may also be formed unevenly according to the curves, and accordingly, internal electrodes of the touch screen panel 160 may contact each other to cause a short circuit.

To prevent the above problem, when a fluid of the organic encapsulation layer 420 is observed in the monitoring groove 345, a thickness of the organic encapsulation layer 420 of the encapsulation layer 400 is increased to planarize the encapsulation layer 400. For example, while performing printing by setting a target thickness of the organic encapsulation layer 420 to $t_1$ by using an inkjet process, when a fluid of the organic encapsulation layer 420 is observed in the monitoring groove 345, the target thickness $t_1$ may be doubled (e.g., increased by 100%). However, exemplary embodiments of the present inventive concepts are not limited thereto. For example in other exemplary embodiments, the target thickness $t_1$ may be increased in a range of 35-300%. In view of the overflowed volume of the organic encapsulation layer 420 to the outer portion of the dam 340, an amount of the organic encapsulation layer 420 is compensated for such that the organic encapsulation layer 420 is sufficient to planarize the encapsulation layer 400.

Accordingly, the organic encapsulation layer 420 having a sufficient and uniform thickness may be evenly formed in the encapsulation layer 400, thereby preventing a short circuit in the touch screen panel 160 or the like.

A crack dam 360 is formed in an other portion (e.g., a portion farther from the display area DA) of the substrate 100 by forming a discontinuous section 355 by removing a portion of the inorganic insulating layers 110 and 109 on the substrate 100. The crack dam 360 may be adjacent to an outer portion of the blocking block 350. The crack dam 360 prevents inward spreading of a crack along the inorganic insulating layers 110 and 109. For example, the function of preventing the spreading of a crack is performed by using the discontinuous section 355 at the inner side of the crack dam 360 (e.g., the lateral side of the crack dam 360 closest to the display area DA).

The display apparatus having the above-described configuration may be manufactured according to a process illustrated in FIGS. 4A through 4E. An area including the dam 340, the blocking block 350, and the crack dam 360 of the non-display area NDA is mainly illustrated in FIGS. 4A-4E for convenience of explanation.

Figure 4A:
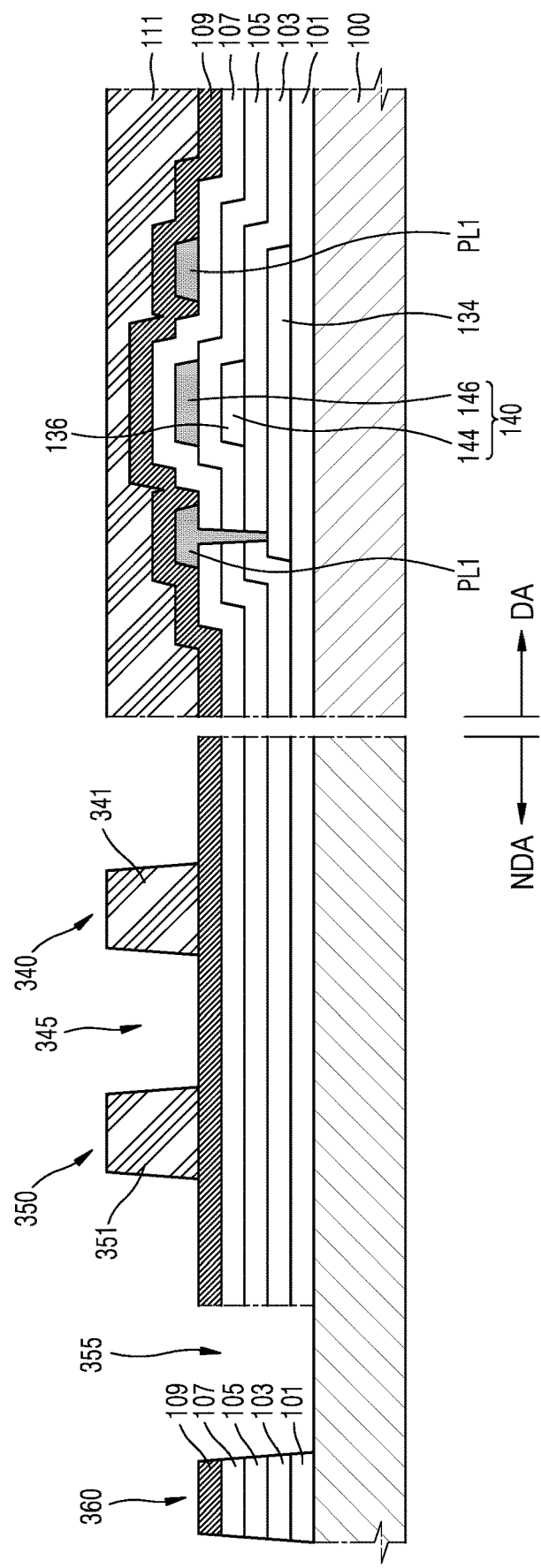
FIGS. 4A through 4E are cross-sectional views illustrating a method of manufacturing a display apparatus according to exemplary embodiments of the present inventive concepts.

As illustrated in the exemplary embodiment of FIG. 4A, the buffer layer 101 is formed on the substrate 100 in the display area DA and the non-display area NDA. The semiconductor layer 134 of the display area DA is formed on the buffer layer 101. The gate insulating layer 103 is formed, and the gate electrode 136 of the display area DA, which also serves as the first storage capacitive plate 144, is formed on the gate insulating layer 103. The first interlayer insulating layer 105, the second storage capacitive plate 146, the second interlayer insulating layer 107, and the first conductive layer PL1 are sequentially formed (e.g., stacked in the Z direction), and the first conductive layer PL1 is covered by the inorganic insulating layer 109 and the first planarization layer 111.

In the non-display area NDA, the first layer 341 of the dam 340 and the first layer 351 of the blocking block 350 are also formed of a same material as the material of the first planarization layer 111, and the discontinuous section 355 and the crack dam 360 described above are formed in an outer portion of the substrate 100 (e.g., a portion of the non-display area NDA displaced away from the display area DA).

Figure 4B:
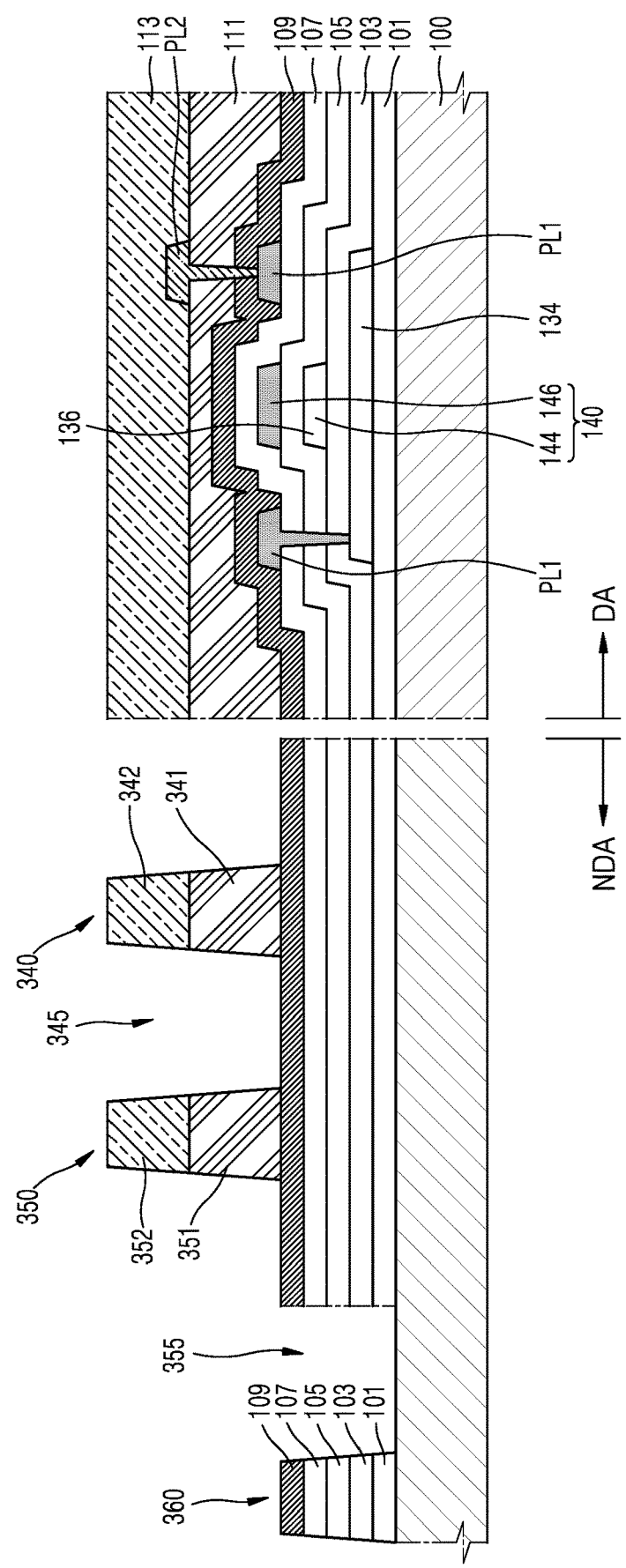

As illustrated in the exemplary embodiment of FIG. 4B, the second conductive layer PL2 is formed in the display area DA, and the second planarization layer 113 is formed on the second conductive layer PL2.

In the non-display area NDA, the second layer 342 of the dam 340 and the second layer 352 of the blocking block 350 are formed together of a same material as the material of the second planarization layer 113.

Figure 4C:
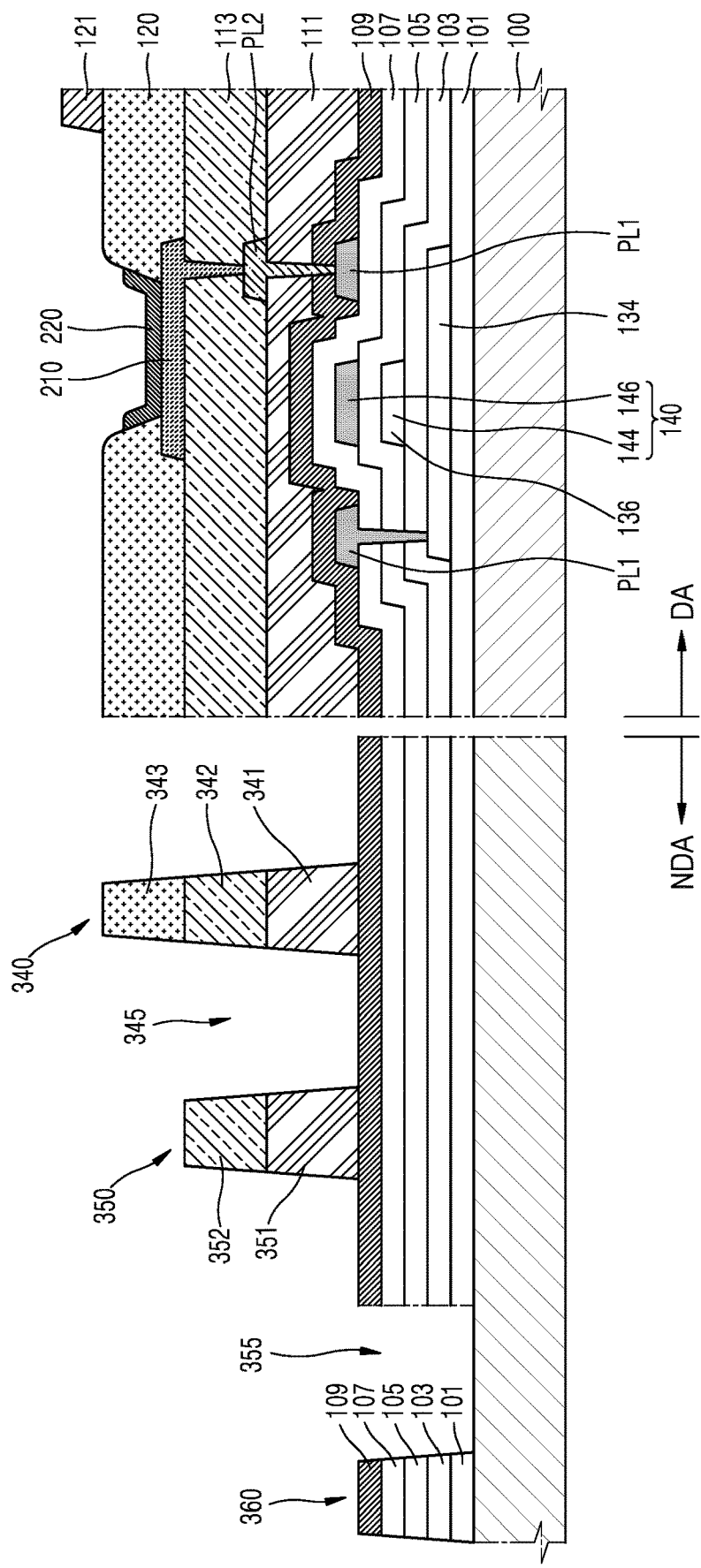

As illustrated in the exemplary embodiment of FIG. 4C, the pixel electrode 210, the pixel-defining layer 120, and the spacer 121 are formed in the display area DA.

The third layer 343 of the dam 340 is also formed of a same material as the material of the pixel-defining layer 120 in the non-display area NDA.

Figure 4D:
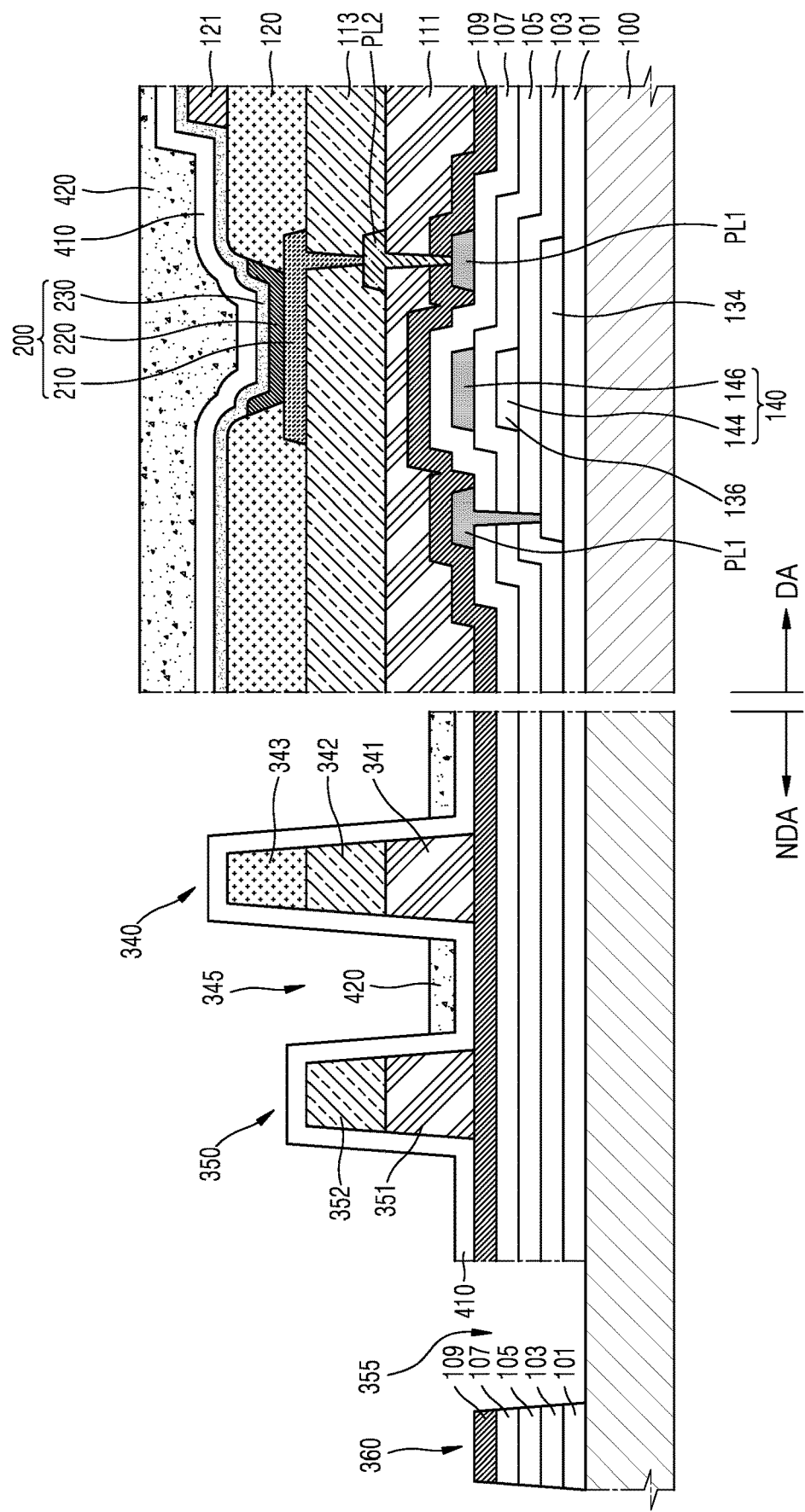

As illustrated in the exemplary embodiment of FIG. 4D, the intermediate layer 220 and the opposite electrode 230 are formed, and the first inorganic encapsulation layer 410 and the organic encapsulation layer 420 of the encapsulation layer 400 are formed thereon. The first inorganic encapsulation layer 410 may be formed using a deposition process, and the organic encapsulation layer 420 may be formed using an inkjet process.

In instances in which the organic encapsulation layer 420 having good flowability flows over the dam 340 and fills the monitoring groove 345 between the outer lateral sidewall of the dam 340 and an inner sidewall of the blocking block 350, the fluid of the organic encapsulation layer 420 is collected in the monitoring groove 345 and may be quickly identified by the naked eye of an operator or a camera.

Accordingly, when the fluid of the organic encapsulation layer 420, collected in the monitoring groove 345, is observed, an inkjet process is additionally performed by increasing a target thickness of the organic encapsulation layer 420. The fluid of the organic encapsulation layer 420 observed in the monitoring groove 345 indicates that the organic encapsulation layer 420 of the encapsulation layer 400 has excessively flowed over to the outer portion of the dam 340 and thus the organic encapsulation layer 420 having a sufficient thickness is not formed in the encapsulation layer 400. Accordingly, the organic encapsulation layer 420 does not sufficiently fill the above-described valley holes and thus curves are formed on the encapsulation layer 400, and a touch screen panel to be formed thereon is also unevenly thrilled along the curves, which may cause a short circuit as internal electrodes of the touch screen panel may contact each other.

To prevent the above, when a fluid of the organic encapsulation layer 420 is observed in the monitoring groove 345, a thickness of the organic encapsulation layer 420 (e.g., length in the Z direction) of the encapsulation layer 400 is increased. In other words, considering the overflowing of the organic encapsulation layer 420 to the outside and discharging thereof, the volume of the fluid in the organic encapsulation layer 420 is increased so that the organic encapsulation layer 420 is sufficient to planarize the encapsulation layer 400.

Figure 4E:
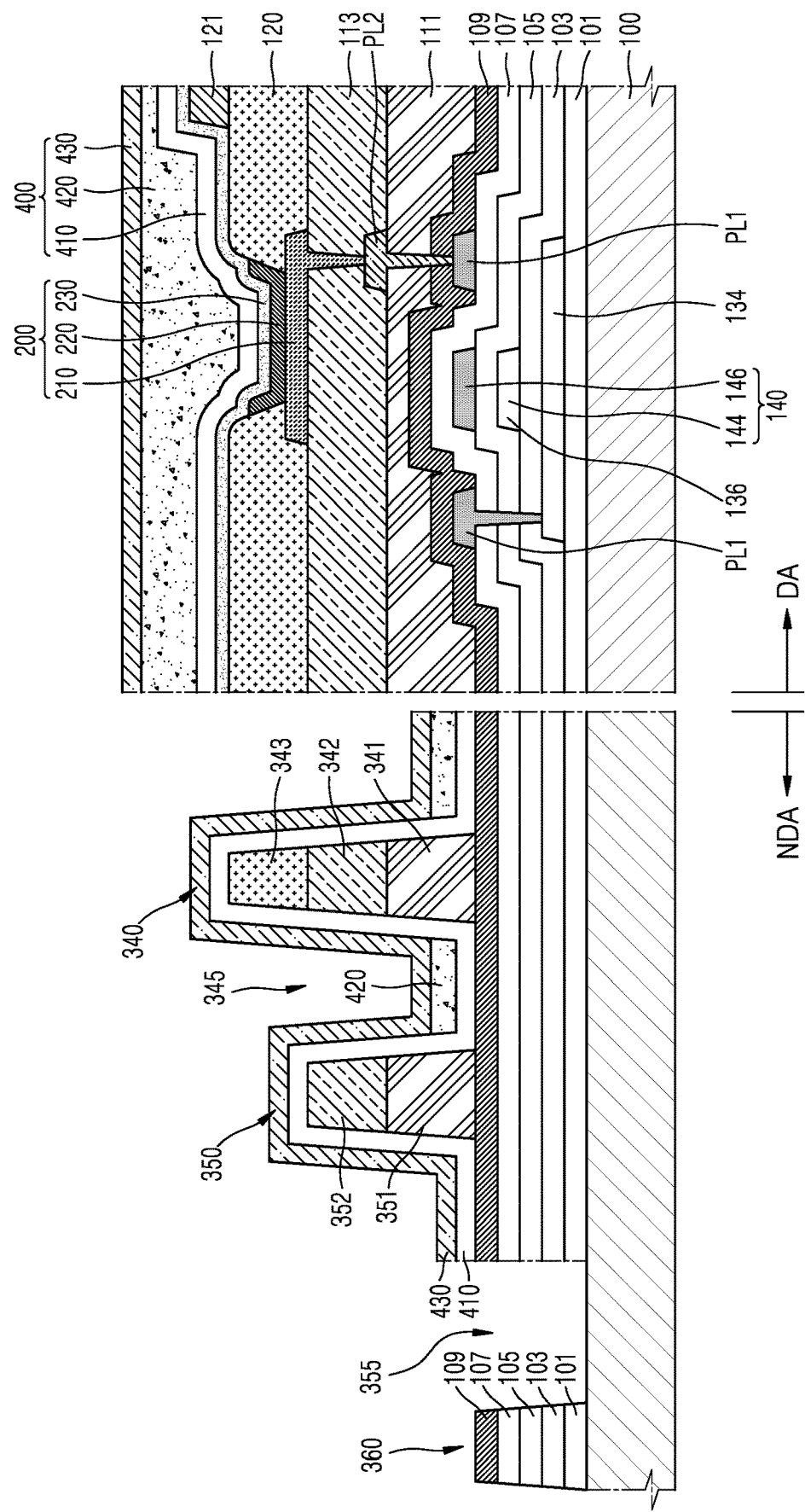

When formation of the organic encapsulation layer 420 is completed with a sufficient thickness and flatness according to the above-described method, the second inorganic encapsulation layer 430 is deposited on the organic encapsulation layer 420 as illustrated in FIG. 4E.

In the non-display area NDA, the second inorganic encapsulation layer 430 covers, together with the first inorganic encapsulation layer 410, the first, second, and third layers 341, 342, and 343 of the dam 340 and the first and second layers 351 and 352 of the blocking block 350.

A touch screen panel is then formed on the encapsulation layer 400.

Thus, by forming the blocking block 350 and observing the flow of the organic encapsulation layer 420 to increase the volume of the organic encapsulation layer 420 in instances in which the organic encapsulation layer 420 overflows to the outer portion of the dam 340, in the above-described manner, an organic encapsulation layer having a sufficient thickness may be uniformly formed, and thus a problem such as a short circuit in a touch screen panel may be prevented and accordingly, a product quality may be consistently maintained in the manufacturing process.

Figure 5A:
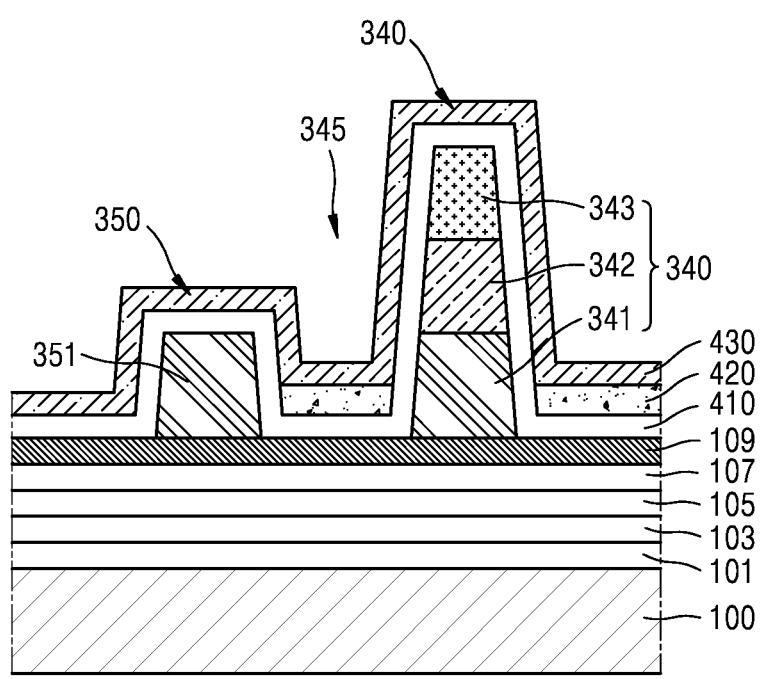
FIGS. 5A through 5D are cross-sectional views illustrating modified examples of a blocking block illustrated in FIG. 2 according to exemplary embodiments of the present inventive concepts.
Figure 5B:
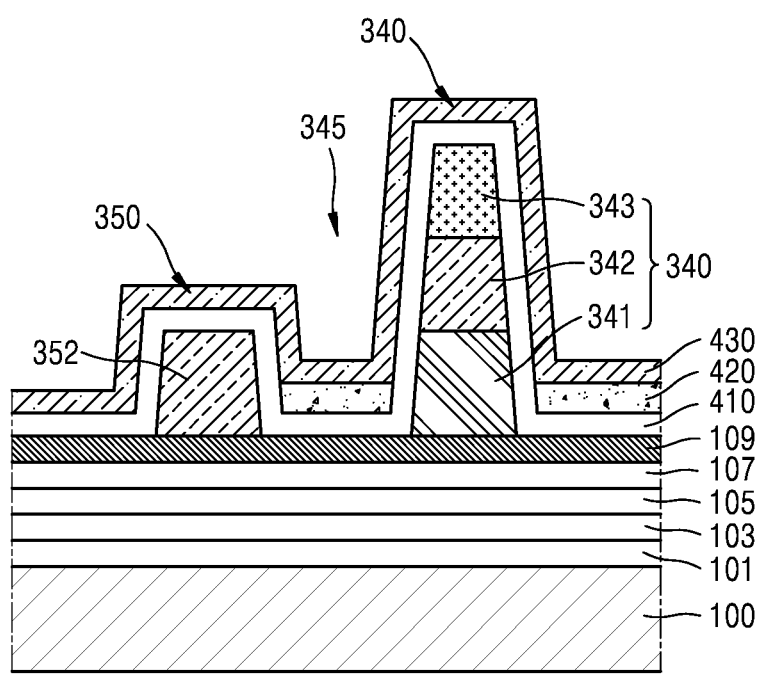

In the above-described embodiment, the blocking block 350 includes the first layer 351, which is an organic insulating layer of a same material as a material of the first planarization layer 111, and the second layer 352, which is an organic insulating layer of a same material as a material of the second planarization layer 113. However, exemplary embodiments of the present inventive concepts are not limited thereto. For example, as illustrated in FIG. 5A, the blocking block 350 may be modified to include only the first layer 351, which is an organic insulating layer of a same material as a material of the first planarization layer 111. The first layer 351 of the blocking block 350 may be thrilled on the same level (e.g., a distance to an upper surface of the substrate 100 in the Z direction) as the first layer 341 of the dam 340. In an alternative exemplary embodiment shown in FIG. 5B, the blocking block 350 may only include the second layer 352, which is an organic insulating layer of a same material as a material of the second planarization layer 113. The second layer 352 of the blocking block 350 may be formed on the same level (e.g., distance to an upper surface of the substrate 100 in the Z direction) as the first layer 341 of the dam 340. That is, without stacking two organic insulating layers, but by using just any one layer, the blocking block 350 may be formed.

Figure 5C:
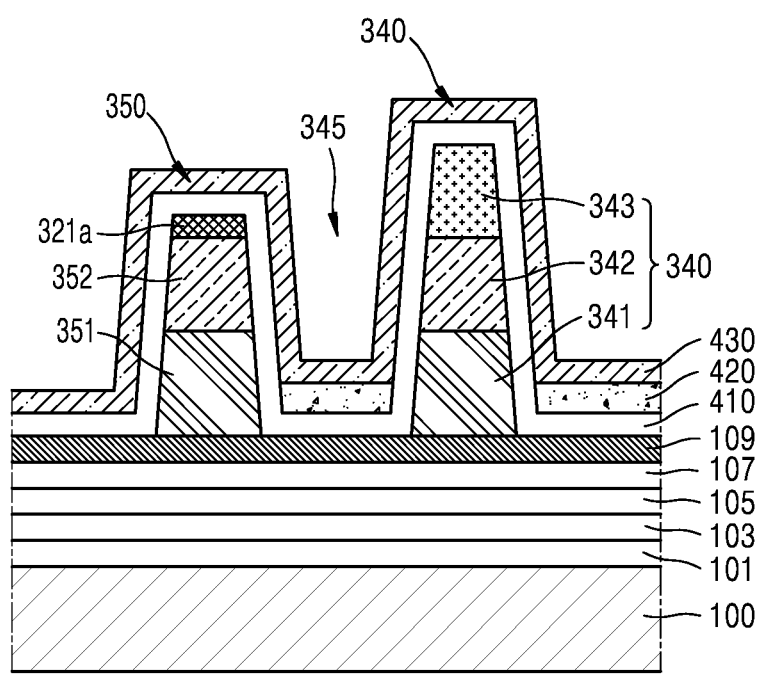

Alternatively, as illustrated in the exemplary embodiment of FIG. 5C, a metal layer 321a formed of a same material as that of the pixel electrode 210 may be further stacked on the first and second layers 351 and 352. For example, as shown in the exemplary embodiment of FIG. 5C, a lower surface of the metal layer 321a may be disposed directly on an upper surface of the second layer 352. In the above-described exemplary embodiments, the blocking block 350 including a combination of the first and second layers 351 and 352, which are organic insulating layers, and the first and second inorganic encapsulation layers 410 and 430 covering the first and second layers 351 and 352 is illustrated. However, as illustrated in the exemplary embodiment of FIG. 5C, the metal layer 321a may be further included to further increase a protrusion height (e.g., length in the Z direction) of the blocking block 350.

Figure 5D:
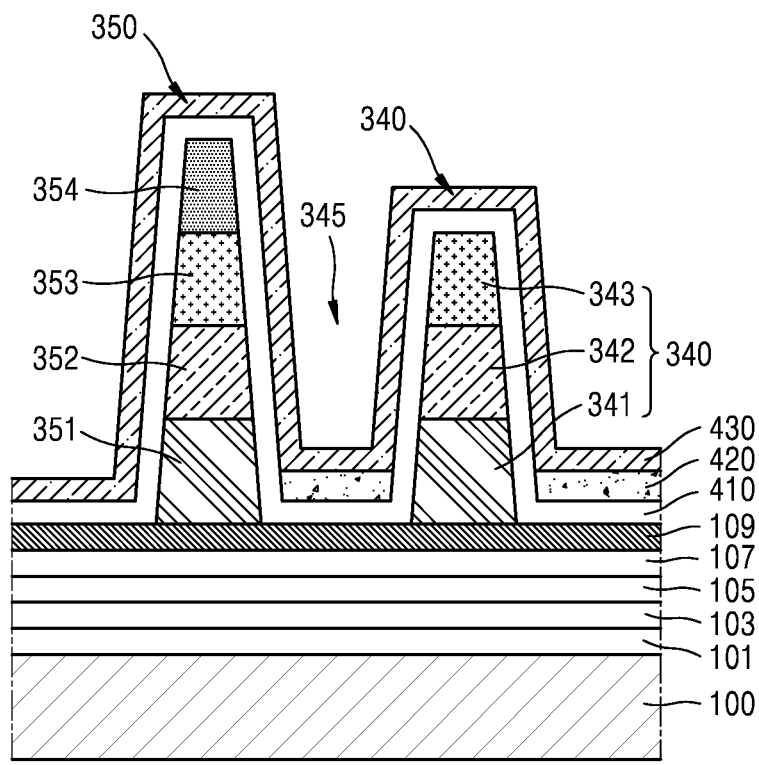

In addition, as illustrated in the exemplary embodiment of FIG. 5D, the blocking block 350 may include a structure including the first layer 351, which is an organic insulating layer of a same material as the material of the first planarization layer 111, the second layer 352, which is an organic insulating layer of a same material as the material of the second planarization layer 113, a third layer 353 of a same material as the material of the pixel-defining layer 120, and a fourth layer 354 of a same material as the material of the spacer 121. The first through fourth layers 351, 352, 353, 354 of the blocking block 350 may be sequentially stacked on each other (e.g., in the Z direction).

As described above, a stack structure of the blocking block 350 may be modified in various manners and exemplary embodiments may have various other arrangements for the structure of the blocking block 350.

Figure 6A:
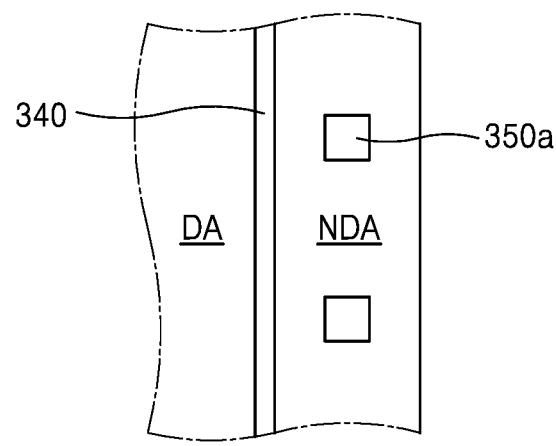
FIGS. 6A through 6D are top plan views illustrating modified examples of a blocking block illustrated in FIG. 1 according to exemplary embodiments of the present inventive concepts.
Figure 6B:
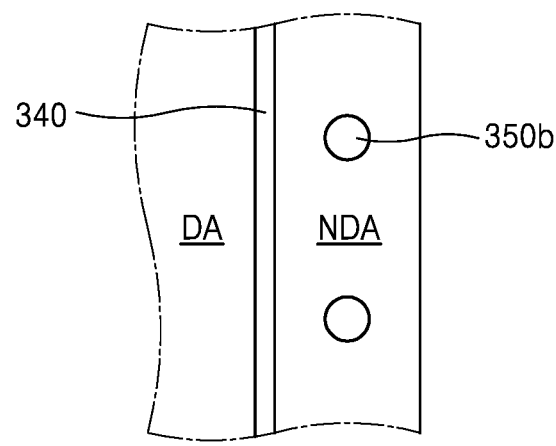
Figure 6C:
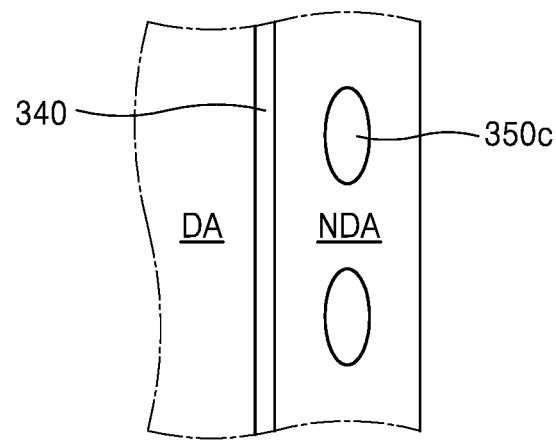
Figure 6D:
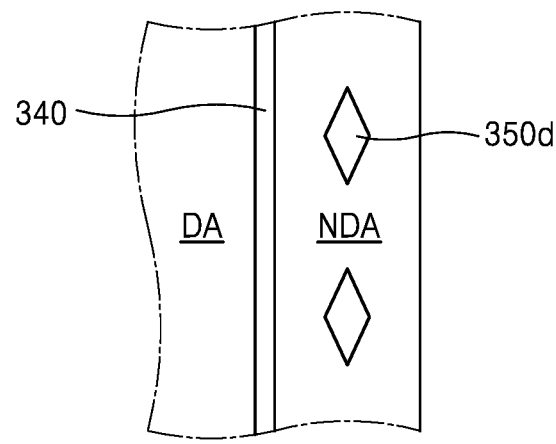

In addition, as shown in the exemplary embodiment of FIG. 1, the blocking block 350 may have a rectangular shape in a plan view (e.g., when viewed from the Z direction). However, exemplary embodiments of the present inventive concepts are not limited thereto and the blocking block 350 may also have other various planar shapes. For example, as shown in the exemplary embodiment of FIG. 6A, a blocking block 350a may have a square shape in a plan view. As shown in the exemplary embodiment of FIG. 6B, a blocking block 350b may have a circular shape in a plan view. As shown in the exemplary embodiment of FIG. 6C, a blocking block 350c may have an elliptical shape in a plan view. As shown in the exemplary embodiment of FIG. 6D, a blocking block 350d may have a diamond shape. The blocking block 350 may have any other planar shape as long as the shape provides a space into which a fluid of the organic encapsulation layer 420 overflowing to an outer portion of the dam 340 may be filled. In an exemplary embodiment, at least one of the plurality of blocking blocks 350 may have a different shape from the other blocking blocks.

Thus, according to the display apparatus and the method of manufacturing the same of the exemplary embodiments of the present inventive concepts described above, an overflowing of an organic encapsulation layer included in an encapsulation layer to an outer portion of the dam may be quickly detected and handled, and thus, an organic encapsulation layer that sufficiently fills valley holes may be uniformly formed, thereby preventing a short circuit or the like in a touch screen panel and stabilizing product quality.

It should be understood that exemplary embodiments of the present inventive concepts described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate having a display area and a non-display area surrounding the display area, the display area including a plurality of pixels;
a blocking block arranged in the non-display area and protruding to prevent a flow of a fluid outside the blocking block, the blocking block including an inner sidewall forming a groove having a pre-defined shape that collects the fluid, wherein the collected fluid is visible in the groove while the groove has the pre-defined shape to detect an overflow of the fluid; and
a dam disposed between the display area and the blocking block, wherein the blocking block and the dam are placed on a same layer, wherein a height from a top surface of the substrate to a top surface of the dam is greater than a height from the top surface of the substrate to a top surface of the blocking block, wherein a height from the top surface of the substrate to a lowermost surface of the dam is equal to a height from the top surface of the substrate to a lowermost surface of the blocking block, wherein the groove is formed continuously between the inner sidewall of the blocking block and an outer sidewall of the dam, and the collected fluid is fluid that overflows to an outer portion of the dam, wherein an entirety of the inner sidewall of the blocking block and the outer sidewall of the dam comprises an organic insulating material, and wherein the lowermost surfaces of the blocking block and the dam are composed of a same organic insulating material.

2. The display apparatus of claim 1, wherein the blocking block comprises a plurality of blocking blocks arranged discontinuously adjacent to a circumference of the display area.

3. The display apparatus of claim 1, further comprising a crack dam adjacent to an outer portion of the blocking block.

4. The display apparatus of claim 1, wherein each pixel of the plurality of pixels comprises:
 a first conductive layer;
 a second conductive layer;
 a pixel electrode;
 a first planarization layer disposed between the first conductive layer and the second conductive layer, the first planarization layer including an organic insulating layer; and
 a second planarization layer disposed between the second conductive layer and the pixel electrode, the second planarization layer including an organic insulating layer.

5. The display apparatus of claim 4, wherein the blocking block comprises a first layer including a same material as a material of at least one of the first planarization layer and the second planarization layer.

6. The display apparatus of claim 5, further comprising:
 a pixel defining layer and a spacer disposed on the second planarization layer,
 wherein the blocking block further comprises a second layer including a same material as a material of at least one of the pixel electrode, the pixel defining layer, and the spacer.

7. The display apparatus of claim 1, further comprising an encapsulation layer covering the display area.

8. The display apparatus of claim 7, wherein:
 the encapsulation layer comprises at least one inorganic encapsulation layer and at least one organic encapsulation layer; and
 the blocking block comprises a layer including a same material as a material of the at least one inorganic encapsulation layer of the encapsulation layer.

9. The display apparatus of claim 1, wherein a planar shape of the blocking block comprises at least one shape selected from a rectangular shape, a square shape, a circular shape, an elliptical shape, and a diamond shape.

10. The display apparatus of claim 1, wherein the blocking block comprises at least one organic insulating layer.

11. A method of manufacturing a display apparatus, the method comprising:
 forming a substrate having a display area and a non-display area surrounding the display area, the display area including a plurality of pixels,
 forming a dam in the non-display area; and
 forming a blocking block that protrudes in the non-display area, the blocking block including an inner sidewall forming a groove having a pre-defined shape that collects fluid, wherein the collected fluid is visible in the groove while the groove has the pre-defined shape to detect an overflow of the fluid,
 wherein the blocking block and the dam are placed on a same layer,
 wherein a height from a top surface of the substrate to a top surface of the dam is greater than a height from the top surface of the substrate to a top surface of the blocking block,
 wherein a height from the top surface of the substrate to a lowermost surface of the dam is equal to a height from the top surface of the substrate to a lowermost surface of the blocking block,
 wherein the groove is formed continuously between an outer sidewall of the dam and the inner sidewall of the blocking block,
 wherein an entirety of the inner sidewall of the blocking block and the outer sidewall of the dam comprises an organic insulating material, and
 wherein the lowermost surfaces of the blocking block and the dam are composed of a same organic insulating material.

12. The method of claim 11, wherein the forming of the blocking block includes forming a plurality of blocking blocks arranged discontinuously that are adjacent to a circumference of the display area.

13. The method of claim 11, further comprising forming a crack dam in the non-display area, the crack dam configured to prevent a propagation of cracks to the display area.

14. The method of claim 13, further comprising forming an encapsulation layer covering the display area.

15. The method of claim 14, wherein:
 the forming of an encapsulation layer comprises forming at least one inorganic encapsulation layer and at least one organic encapsulation layer; and
 a thickness of the at least one organic encapsulation layer is increased if a portion of the at least one organic encapsulation layer is collected in the groove formed between the inner sidewall of the blocking block and the outer sidewall of the dam when forming the at least one organic encapsulation layer.

16. The method of claim 11, wherein each pixel of the plurality of pixels comprises:
 a first conductive layer;
 a second conductive layer;
 a pixel electrode;
 a first planarization layer disposed between the first conductive layer and the second conductive layer, the first planarization layer including an organic insulating layer; and
 a second planarization layer disposed between the second conductive layer and the pixel electrode, the second planarization layer including an organic insulating layer.

17. The method of claim 16, wherein the blocking block comprises a layer including a same material as a material of at least one of the first planarization layer and the second planarization layer.

18. The method of claim 17, wherein:
a pixel defining layer and a spacer are further provided on the second planarization layer,
wherein the blocking block is further formed as a layer including a same material as a material of at least one of the pixel electrode, the pixel defining layer, and the spacer.

19. The method of claim 11, wherein a planar shape of the blocking block comprises at least one shape selected from a rectangular shape, a square shape, a circular shape, an elliptical shape, and a diamond shape.

20. The method of claim 11, wherein the blocking block comprises at least one organic insulating layer.

\* \* \* \* \*